United States Patent
Ivira et al.

(10) Patent No.: US 10,177,736 B2
(45) Date of Patent: Jan. 8, 2019

(54) BULK ACOUSTIC WAVE RESONATOR COMPRISING MULTIPLE ACOUSTIC REFLECTORS

(71) Applicant: Avago Technologies General IP (Singapore) Pte. Ltd., Singapore (SG)

(72) Inventors: Brice Ivira, San Jose, CA (US); Tiberiu Jamneala, San Francisco, CA (US); Domingo Figueredo, Fremont, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 467 days.

(21) Appl. No.: 14/725,086

(22) Filed: May 29, 2015

(65) Prior Publication Data
US 2016/0352308 A1 Dec. 1, 2016

(51) Int. Cl.
*H03H 9/17* (2006.01)

(52) U.S. Cl.
CPC ............ *H03H 9/175* (2013.01); *H03H 9/173* (2013.01)

(58) Field of Classification Search
CPC ........ H03H 9/175; H03H 9/173; H03H 9/178; H03H 9/025
USPC .................................................. 310/321, 348
See application file for complete search history.

(56) References Cited

U.S. PATENT DOCUMENTS

| | | |
|---|---|---|
| 5,587,620 A | 12/1996 | Ruby et al. |
| 5,872,493 A | 2/1999 | Ella |
| 5,873,153 A | 2/1999 | Ruby et al. |
| 5,910,756 A | 6/1999 | Ella |
| 6,107,721 A | 8/2000 | Lakin |
| 6,262,637 B1 | 7/2001 | Bradley et al. |
| 6,278,342 B1 | 8/2001 | Ella |
| 6,507,983 B1 | 1/2003 | Ruby et al. |
| 6,828,713 B2 | 12/2004 | Bradley et al. |
| 6,842,089 B2 | 1/2005 | Lee |
| 7,057,478 B2 | 6/2006 | Korden et al. |
| 7,280,007 B2 | 10/2007 | Feng et al. |
| 7,345,410 B2 | 3/2008 | Grannen et al. |
| 7,388,454 B2 | 6/2008 | Ruby et al. |
| 7,561,009 B2 | 7/2009 | Larson et al. |
| 7,612,636 B2 | 11/2009 | Jamneala et al. |
| 7,622,846 B2 | 11/2009 | Song et al. |
| 7,629,865 B2 | 12/2009 | Ruby et al. |
| 7,658,858 B2 | 2/2010 | Hong et al. |
| 7,714,684 B2 | 5/2010 | Ruby et al. |

(Continued)

FOREIGN PATENT DOCUMENTS

EP  1998444 A2  12/2008

OTHER PUBLICATIONS

Co-pending U.S. Appl. No. 14/161,564, filed Jan. 22, 2014.

(Continued)

*Primary Examiner* — Bryan P Gordon

(57) ABSTRACT

A bulk acoustic wave (BAW) resonator includes: a plurality of acoustic reflectors disposed in a substrate; a lower electrode disposed over the plurality of acoustic reflectors; a piezoelectric layer disposed over the lower electrode; and a plurality of upper electrodes, disposed over the piezoelectric layer. One of the plurality of upper electrodes is formed over a respective one of the plurality of acoustic reflectors. Each of the plurality of upper electrodes, the piezoelectric layer, the lower electrode, and each of the acoustic reflectors form an individual active area.

23 Claims, 10 Drawing Sheets

(56) References Cited

U.S. PATENT DOCUMENTS

| | | |
|---|---|---|
| 7,791,434 B2 | 9/2010 | Fazzio et al. |
| 8,188,810 B2 | 5/2012 | Fazzio et al. |
| 8,230,562 B2 | 7/2012 | Fazzio et al. |
| 8,248,185 B2 | 8/2012 | Choy et al. |
| 8,723,623 B2 | 5/2014 | Hara et al. |
| 2007/0205850 A1 | 9/2007 | Jamneala et al. |
| 2007/0279155 A1* | 12/2007 | Uno ................. H03H 3/02 333/191 |
| 2010/0327701 A1* | 12/2010 | Grannen ............. H03H 3/04 310/346 |
| 2010/0327994 A1 | 12/2010 | Choy et al. |
| 2011/0180391 A1 | 7/2011 | Larson, III et al. |
| 2011/0248602 A1 | 10/2011 | Defay et al. |
| 2011/0266925 A1 | 11/2011 | Ruby et al. |
| 2012/0177816 A1 | 7/2012 | Larson, III et al. |
| 2012/0194297 A1* | 8/2012 | Choy ............. H03H 9/02118 333/187 |
| 2012/0326807 A1 | 12/2012 | Choy et al. |
| 2013/0049545 A1* | 2/2013 | Zou .................. H03H 3/04 310/346 |
| 2014/0125203 A1* | 5/2014 | Choy ............. H03H 9/02118 310/365 |
| 2014/0191825 A1* | 7/2014 | Son ............... H03H 9/02102 333/189 |
| 2014/0232486 A1* | 8/2014 | Burak ............... H03H 9/175 333/187 |
| 2016/0065171 A1 | 3/2016 | Ruby et al. |
| 2016/0191015 A1 | 6/2016 | Ivira et al. |

OTHER PUBLICATIONS

Co-pending U.S. Appl. No. 13/662,460, filed Oct. 27, 2012.
Co-pending U.S. Appl. No. 13/906,873, filed May 31, 2013.
Co-pending U.S. Appl. No. 14/191,771, filed Feb. 27, 2014.

* cited by examiner

BULK ACOUSTIC WAVE RESONATOR COMPRISING MULTIPLE ACOUSTIC REFLECTORS

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, etc.) for example, connected between an antenna and a transceiver for filtering received and transmitted signals.

Various types of filters use mechanical resonators, such as bulk acoustic wave (BAW) resonators, including film bulk acoustic resonators (FBARs) and solidly mounted resonators (SMRs), or surface acoustic wave (SAW) resonators. The resonators convert electrical signals to mechanical signals or vibrations, and/or mechanical signals or vibrations to electrical signals. A BAW resonator, for example, is an acoustic device comprising a stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator includes a piezoelectric film as the piezoelectric material, which may be referred to as an FBAR as noted above. FBARs resonate at GHz frequencies, and are thus relatively compact, having thicknesses on the order of microns and length and width dimensions of hundreds of microns.

Resonators may be used as band-pass filters with associated passbands providing ranges of frequencies permitted to pass through the filters. With increasing power requirements placed on devices (e.g., mobile phones), ever increasing power demands are placed on filters, and particularly the resonators of the filters. While increasing the active area of a resonator decreases power density, providing an increase in its power handling capability, there is a point of diminishing return. In particular, as the size of the resonator increases, a point is reached where the ability of the resonator to dissipate power is diminished mainly due to a non-uniform strain/stress profile and relatively increased overall thermal resistance compared to smaller active-area resonators. In addition to operating at relatively higher temperatures with increased power, resonators with significantly larger areal dimensions also develop more non-uniform thermal gradients, which weakens the resonator at certain locations in the active area. Ultimately, the power handling capability of the comparatively large active area resonators is limited, and its electrical performance is compromised.

What is needed, therefore, is a BAW resonator that overcomes at least the shortcomings of known BAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
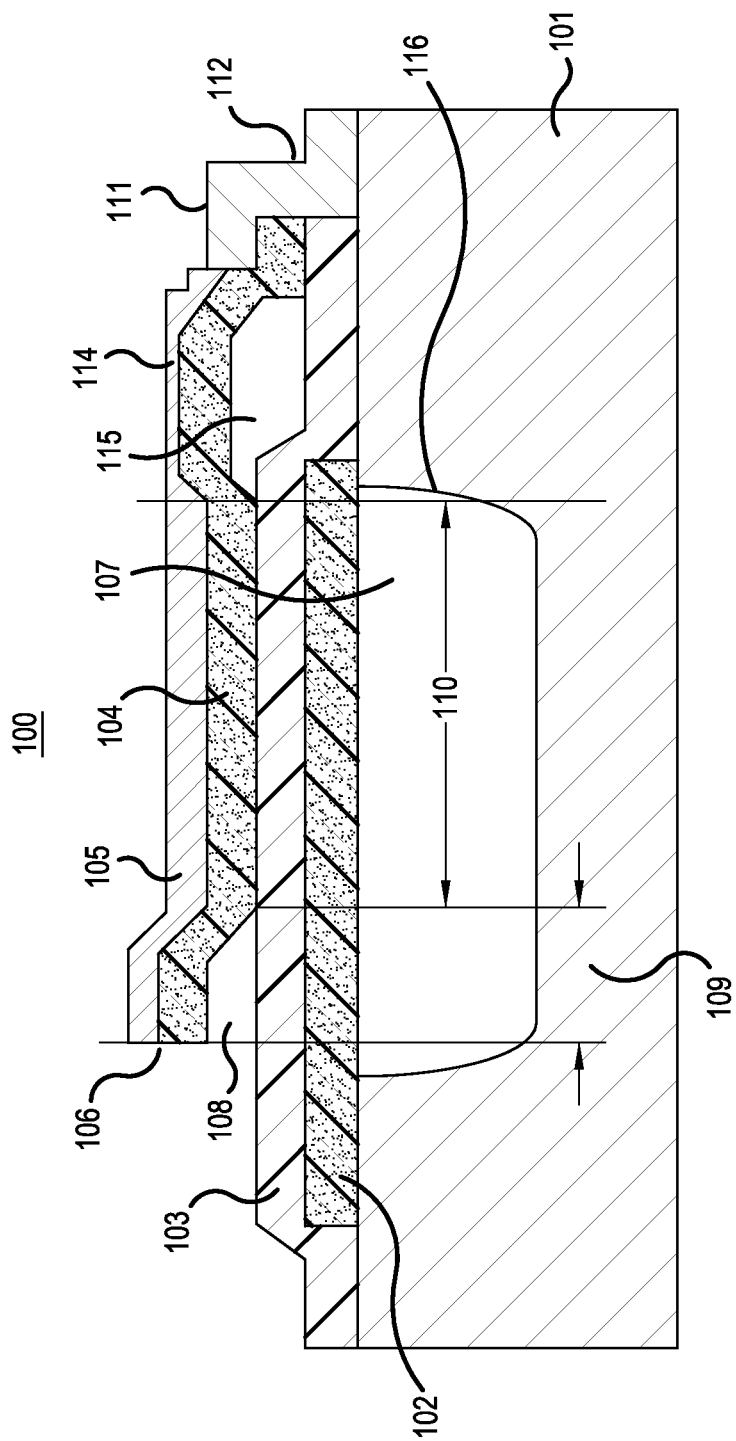
FIG. 1A is a cross-sectional view of a bulk acoustic wave (BAW) resonator useful in representative embodiments.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

According to representative embodiments described below, resonator structures are provided with multiple active areas over a common substrate to provide improved power handling. The acoustic resonator structures useful in the apparatuses of the present teachings comprise BAW resonators, including FBARs or SMRs, although the present teachings contemplate the use of surface acoustic wave (SAW) resonators. When connected in a selected topology, a plurality of the resonators can act as an electrical filter. For example, the acoustic resonators may be arranged in a ladder-filter or lattice-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers (diplexers, triplexers, quadplexers, quintplexers, etc.)

A variety of materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,791,434 8,188,810, and 8,230,562 to Fazzio, et al.; U.S. Pat. No. 7,280,007 to Feng et al.; U.S. Pat. Nos. 8,248,185 and 8,902,023 to Choy, et al.; U.S. Pat. No. 7,345,410 to Grannen, et al.; U.S. Pat No. 6,828,713 to Bradley, et al.; U.S. Pat. No. 7,561,009 to Larson, et al.; U.S. Patent Application Publication No. 20120326807 to Choy, et al.; U.S. Patent Application Publications Nos. 20110180391 and 20120177816 to Larson III, et al.; U.S. Patent Application Publication No. 20070205850 to Jamneala et al.; U.S. Patent Application Publication No. 20110266925 to Ruby, et al.; U.S. Patent Application Publication No. 20130015747 to Ruby, et al.; U.S. Patent Application Publication No. 20130049545 to Zou, et al.; U.S. Patent Application Publication No. 20140225682 to Burak, et al.; U.S. Patent Publication No. 20140132117 to John L. Larson III; U.S. Patent Publication Nos.: 20140118090 and 20140354109; and U.S. patent application Ser. No. 14/191,771, entitled "Bulk Acoustic Wave Resonator having Doped Piezoelectric Layer" to Feng, et al. and filed on Feb. 27, 2014. The entire disclosure of each of the patents, patent application publications, and the patent application, listed above are hereby specifically incorporated by reference herein. It is emphasized that the components, materials and method of fabrication described in these patents and patent applications are representative and other methods of fabrication and materials within the purview of one of ordinary skill in the art are also contemplated.

By way of example, FIG. 1A depicts a cross-sectional view of BAW resonator 100 contemplated for use in the various apparatuses of the present teachings. As can be appreciated, the BAW resonator 100 comprises an FBAR. It is emphasized that the BAW resonator 100 is merely illustrative, and that other known BAW resonators are contemplated for use in the various apparatuses of the present teachings.

The BAW resonator 100 comprises a substrate 101, a lower electrode 102 disposed beneath a piezoelectric layer 103, which comprises a first surface in contact with a lower electrode 102 and a second surface in contact with a upper electrode 104. An optional passivation layer 105 is provided over the upper electrode 104. As will become clearer as the present description continues, the substrate 101 comprises a material that is not only amendable to known microfabrication and semiconductor processing methods, but also has a comparatively good thermal conductivity. Generally, the substrate 101 comprises silicon (i.e., polycrystalline or monocrystalline), but other materials, such as gallium arsenide (GaAs) and indium phosphide (InP), are contemplated.

A cantilevered portion 106 of the upper electrode 104 is provided on at least one side of the upper electrode 104. The cantilevered portion 106 may also be referred to as a 'wing.' It is emphasized that the use of the cantilevered portion 106 is merely illustrative, and other structures useful in improving the performance of the BAW resonator 100' (e.g., a frame element disposed adjacent to the perimeter of the active area 110) are contemplated for use in addition to, or instead of the cantilevered portion 106.

The lower and upper electrodes 102, 104 each comprise one or two (bi-electrode) electrically conductive materials (e.g., molybdenum (Mo), W, Pt, Ru, Al, Ta, Cu, or Ru) and provide an oscillating electric field in the z-direction of the coordinate system shown (i.e., the direction of the thickness of the substrate 101). In the illustrative embodiment described presently, the z-axis is the axis for the TE (thickness-extensional or "longitudinal") mode(s) for the resonator. In a representative embodiment, the piezoelectric layer 103 and lower and upper electrodes 102, 104 are suspended over a cavity 107 that substantially provides acoustic isolation with the substrate 101. Accordingly, the BAW resonator 100 is a mechanical resonator, which can be electrically coupled via the piezoelectric layer 103. Other configurations that foster mechanical resonance by FBARs are contemplated. For example, as described in connection with FIG. 1B, rather than cavity 107, the BAW resonator 100 can be located over an acoustic Bragg reflector, such as a mismatched acoustic Bragg reflector (not shown in FIG. 1A) formed in or on the substrate 101 to provide acoustic isolation.

The cantilevered portion 106 of the upper electrode 104 extends over a gap 108, which illustratively comprises air. In a representative embodiment, a sacrificial layer (not shown) is deposited by a known technique over the lower electrode 102 and a portion of the piezoelectric layer 103.

Figure 3:
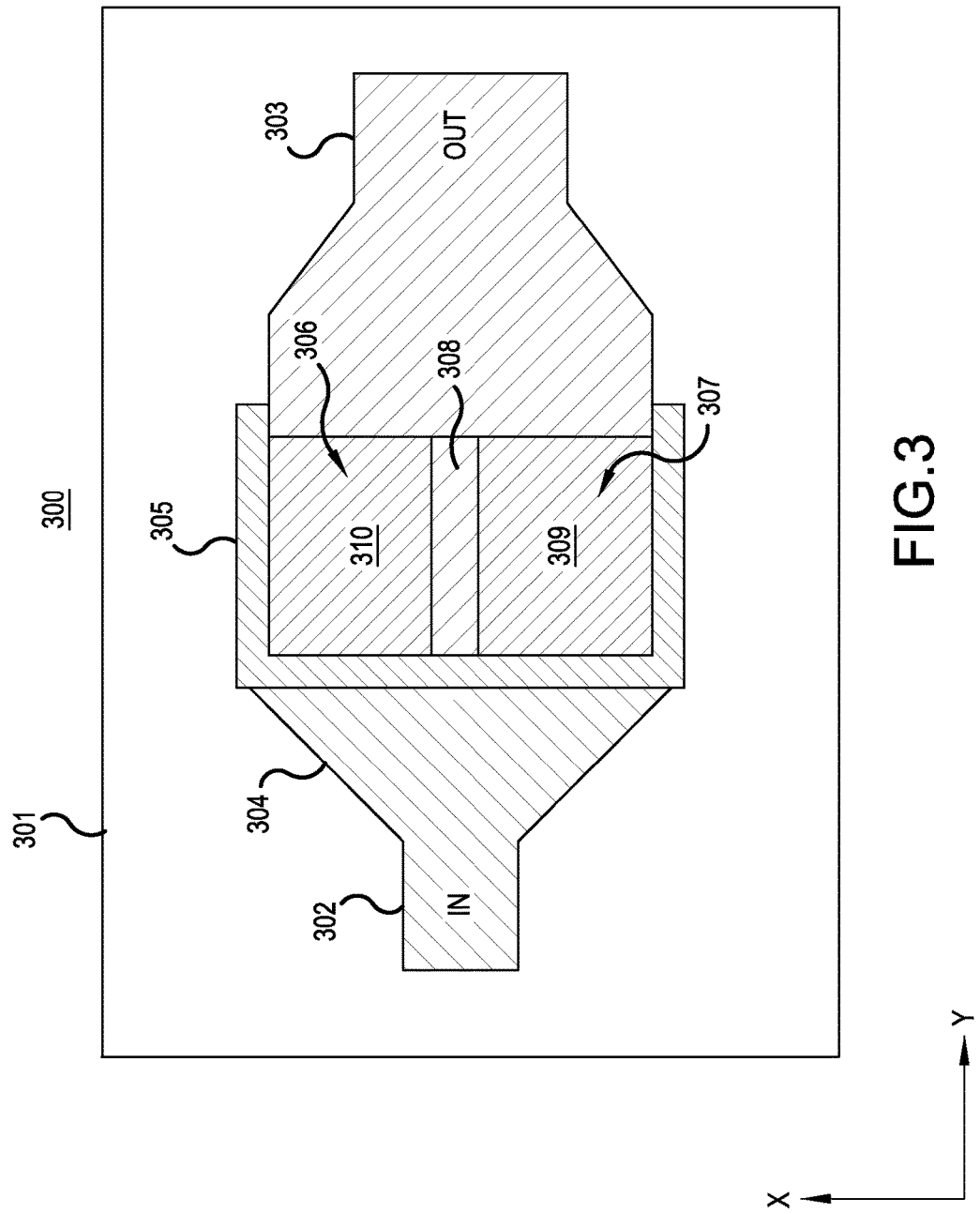
FIG. 3 is a top view of a BAW resonator according to a representative embodiment.

The BAW resonator 100 comprises a bridge 114 along the interconnection side 112. The bridge 114 provides a gap 115, which may be a void (e.g., air) or may be filled with a low acoustic impedance material (e.g., non-etchable borosilicate glass (NEBSG), carbon doped silicon dioxide (CDO), or silicon carbide (SiC)). The bridge 114 is described in above-referenced U.S. Pat. No. 8,248,185), and as such many of the details of the bridge 114 are not repeated in the present application to avoid obscuring the description of the representative embodiments of the BAW resonator 100. As depicted in FIG. 3, the cavity 107 has an edge 116, and the bridge 114 extends past the edge 116 of the cavity 107 (or similar reflective element, such as a mismatched Bragg reflector) and over the substrate 101. As such, in a representative embodiment, the bridge 114 is disposed partially over the cavity 107, extends over the edge 116 of the cavity 107, and is disposed partially over the substrate 101.

The bridge 114 is depicted in FIG. 1A as a terminus (e.g., to an input or an output to the BAW resonator 100), and is connected to an electrical contact 111 along the interconnection side 112. However, and as will become clearer as the present description continues, in accordance with representative embodiments described below, the bridge 114 is also implemented to effect the electrical connection from an active area to another active area of a BAW resonator comprising a plurality of active areas. Specifically, in various representative embodiments described below, the bridge 114 electrically connects upper electrode 104 to another electrode (e.g., upper electrode) that is part of another active area.

As noted above, the cantilevered portion 106 provides an improvement in the Q-factor. Similarly, the bridge 114 also provides an improvement in the Q-factor. Beneficially, the combination of the cantilevered portion 106 and the bridge 114 provides a further improvement in the Q-factor of the BAW resonator 100. To this end, inclusion of the bridge 114 with the cantilevered portion 106 in the BAW resonator 100 results in an improvement in the Q-factor at parallel resonance (Qp) and some impact on the Q-factor at series resonance (Qs). This is somewhat expected since the bridge 114 predominantly impacts Qp, as described in above-referenced U.S. Pat. No. 8,248,145 to Choy, et al.

The region of contacting overlap of the lower and upper electrodes 102, 104, the piezoelectric layer 103 and the cavity 107, or other acoustic reflector (e.g., Bragg reflector (see FIG. 1B)) is referred to as an active area 110 of the BAW resonator 100. The acoustic motion of particles is launched and propagating in this area. By contrast, an inactive area of the BAW resonator 100 comprises a region of overlap between lower electrode 102, or upper electrode 104, or both, and the piezoelectric layer 103 is not disposed over the cavity 107, or other acoustic reflector (e.g., Bragg reflector).

The portion of the inactive area that contacts the substrate 101 may be referred to collectively as an anchor point of the BAW resonator 100 (in this case FBAR). The anchor point on the substrate 101 first ensures the mechanical robustness and support of the entire membrane formed by the acoustic stack over the cavity 107. Notably, when the acoustic reflector is a cavity (e.g., cavity 107), the active area 110 is often referred to as a membrane.

As described more fully below, the anchor point also serves as a heat sink to reduce the temperature of the active area 110 resulting from the self-heating generated by the energy of the RF power in the active area 110 of the BAW resonator 100. By thermal conduction (interaction between phonons-electrons) the heat wave is partially evacuated from the active area 110 of the BAW resonator 100 farther away into the substrate 101, which helps to cool down the active area 110. As air is a comparatively poor thermal conductor, there is no significant heat conduction through the air, and, as such, no heat flow out of the top of or beneath the membrane. However, the heat can be evacuated from the active area 110 only by flowing through the anchor points. Thus, a thermal gradient is generated in the x-y plane. As expected, the center of the active area 110 (membrane when over a cavity) is hotter than the perimeter of the active area 110, which are located closer to the anchor point with substrate 101. As the size of the active area 110 of the BAW resonator 100 increases, the distance the heat has to travel from the center of the BAW resonator 100 to the edge increases and then thermal resistance degrades. In addition, there is potentially more non-uniform stress/strain in the membrane as it gets larger. Ultimately, the BAW resonator can operate at unacceptably high temperatures, which can reduce its electrical performance (mainly manifest in a reduced quality factor (Q) and electromechanical coupling ($kt^2$)); reduce its power handling; degrade its insertion loss; and shift the passband of a filter comprising BAW resonators 100. As described more fully below, the active areas 110 of the BAW resonators 100 used in apparatuses of representative embodiments described actbelow have a comparatively reduced areal size, and thus the distance to their anchor points is comparatively small. As such, the BAW resonators 100 of representative embodiments described herein have improved thermal resistance and exhibit improved thermal distribution across the active area 110 compared to known comparatively larger resonators. Thus, at a comparatively same level of energy density (energy divided by the active area or volume), the comparatively small areal dimensions of the active areas 110 of the BAW resonators of the representative embodiments described below operate at lower temperature and, for their size, provide improved power handling and acceptable electrical performances.

The cantilevered portion 106 extends beyond an edge of the active area 110 by a width 109 as shown. The electrical contact 111 is connected to a signal line (not shown) and electronic components (not shown) selected for the particular application of the BAW resonator 100. This portion of the BAW resonator 100 comprises an interconnection side 112 of the BAW resonator 100. The interconnection side 112 of the upper electrode 104 to which the electrical contact 111 is made does not comprise a cantilevered portion. By contrast, one or more non-connecting sides of the BAW resonator 100 may comprise cantilevered portions 106 that extend beyond the edge of the active area 110.

The piezoelectric layer 103 comprises a highly textured piezoelectric layer (e.g., MN), and thus has a well-defined C-axis. As described more fully below, in an apparatus comprising a plurality of BAW resonators 100, the polarization of each BAW resonator impacts the type of the connection (e.g., series connection, anti-series connection) that is made between the BAW resonators 100. As will be appreciated by one of ordinary skill in the art, the growth of piezoelectric material along a C-axis of the material dictates the polarization of the BAW resonator, and thus the type of connection to be implemented. As such, providing a highly-textured piezoelectric layer 103, such as by methods described in the above-referenced U.S. Patent Application Publications Nos. 20110180391 and 20120177816 to Larson III, et al., is useful in apparatuses comprising BAW resonator 100.

In addition to being highly-textured, the piezoelectric layer 103 of representative embodiments may also comprise one or more rare-earth (e.g., scandium (Sc)) doped layers of piezoelectric material (e.g., aluminum nitride (AlN)) as described in certain patent applications incorporated by reference above (e.g., U.S. patent application Ser. No. 14/161,564 to John L. Larson III; and U.S. patent application Ser. No. 14/191,771 to Feng, et al.).

Figure 1B:
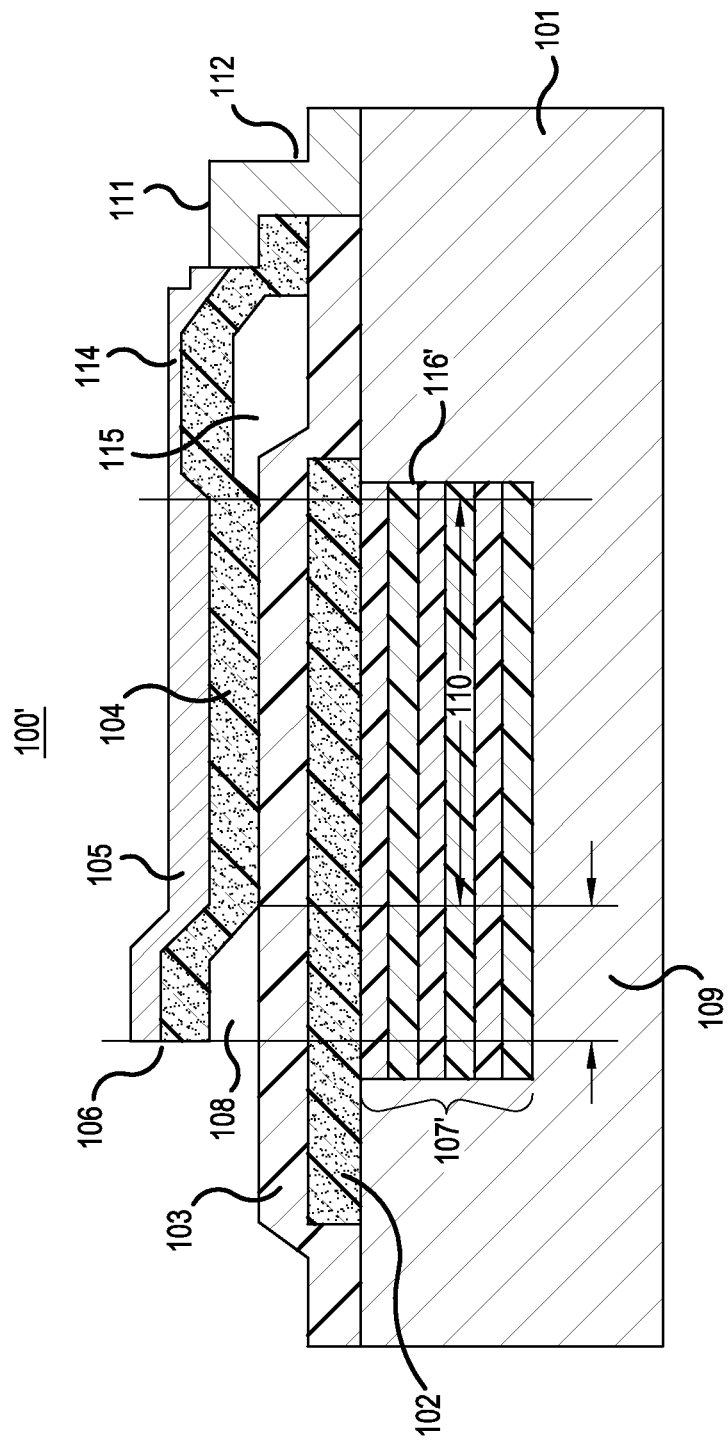
FIG. 1B is a cross-sectional view of a BAW resonator useful in representative embodiments.

FIG. 1B shows a cross-sectional view of a BAW resonator 100' in accordance with a representative embodiment. Many of the features of the BAW resonator 100' are common to those of BAW resonator 100 described in connection with representative embodiments in FIG. 1A. The details of common features, characteristics and benefits thereof are not repeated in order to avoid obscuring the presently described embodiments.

The BAW resonator 100' comprises bridge 114 along the interconnection side 112. The bridge 114 provides a gap 115, which may be a void (e.g., air) or may be filled with a low acoustic impedance material. The bridge 114 is described in above-referenced U.S. Pat. No. 8,248,185, and as such many of the details of the bridge 114 are not repeated in the present application to avoid obscuring the description of the representative embodiments of the BAW resonator 100. As depicted in FIG. 3, the acoustic Bragg reflector 107' has an edge 116', and the bridge 114 extends past the edge 116' of the acoustic Bragg reflector 107' and over the substrate 101. As such, in a representative embodiment, the bridge 114 is disposed partially over the acoustic Bragg reflector 107', extends over the edge 116' of the acoustic Bragg reflector 107', and is disposed partially over the substrate 101.

As described above, the cantilevered portion 106 provides an improvement in the Q-factor. Similarly, the bridge 114 also provides an improvement in the Q-factor. Beneficially, the combination of the cantilevered portion 106 and the bridge 114 provides a further improvement in the Q-factor of the BAW resonator 100'. To this end, inclusion of the bridge 114 with the cantilevered portion 106 in the BAW resonator 100' results in an improvement in the Q-factor at parallel resonance (Qp) and some impact on the Q-factor at series resonance (Qs). This is somewhat expected since the bridge 114 predominantly impacts Qp, as described in above-referenced U.S. Pat. No. 8,248,185 to Choy, et al. As noted above, the cantilevered portion 106 may also be referred to as a 'wing.' It is emphasized that the use of the cantilevered portion 106 is merely illustrative, and other structures useful in improving the performance of the BAW resonator 100' (e.g., a frame element disposed adjacent to the perimeter of the active area 110) are contemplated for use in addition to, or instead of the cantilevered portion 106.

In a representative embodiment, the piezoelectric layer 103 and lower and upper electrodes 102, 104 are disposed over an acoustic Bragg reflector 107', such as a mismatched acoustic Bragg reflector formed in or on the substrate 101. FBARs provided over an acoustic Bragg reflector are sometimes referred to as solid mount resonators (SMRs) and, for example, may be as described in above-referenced U.S. Pat. No. 6,107,721 to Lakin. Accordingly, the BAW resonator 100' is a mechanical resonator, which can be electrically coupled via the piezoelectric layer 103.

The region of contacting overlap of the lower and upper electrodes 102, 104, the piezoelectric layer 103 and the acoustic Bragg reflector 107' is referred to as the active area 110 of the BAW resonator 100'. By contrast, the inactive area of the BAW resonator 100' comprises a region of overlap between lower electrode 102 or upper electrode 104, and the piezoelectric layer 103 is not disposed over the acoustic Bragg reflector 107'. As described more fully in the parent application, it is beneficial to the performance of the BAW resonator 100' to reduce the area of the inactive region of the BAW resonator 100' to the extent practical.

Figure 1C:
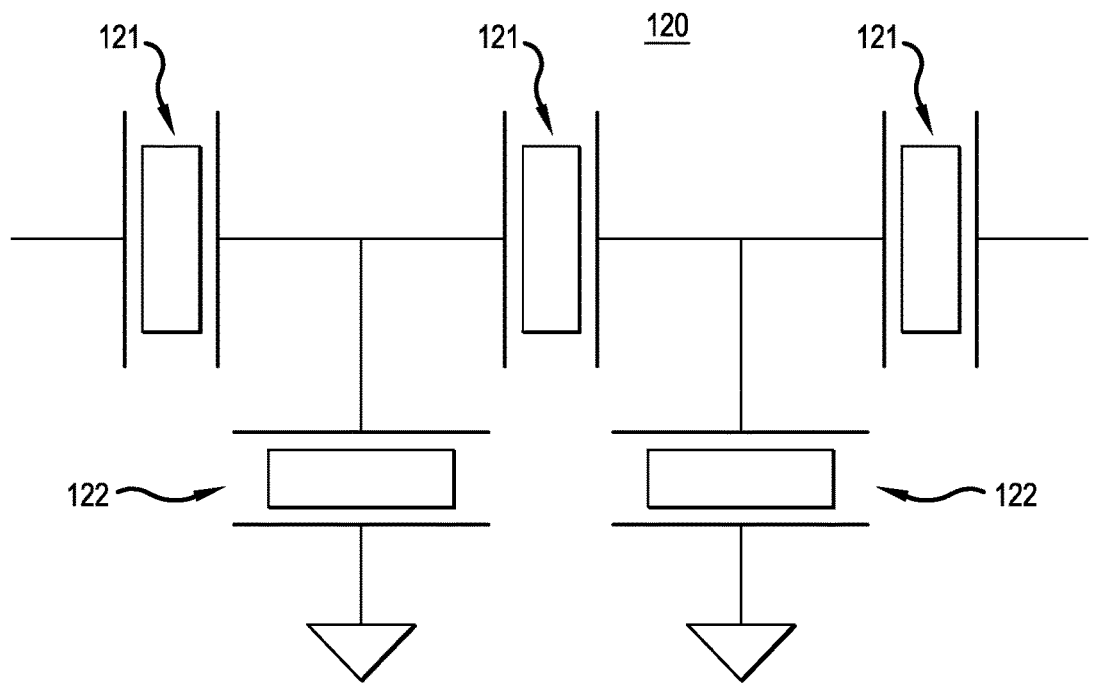
FIG. 1C is a simplified schematic block diagram of a lattice filter in accordance with a representative embodiment.

As alluded to above, and as noted below, the BAW resonators and apparatuses including the BAW resonators of the present teachings are contemplated for use in electrical filter applications, for example. A basic filter design of either a ladder or a lattice topology is constituted of several sections. The number of sections is not limited but selected to trade off performances in term of insertion loss, roll-off and rejection of the filter. FIG. 1C is a simplified schematic block diagram of an electrical filter 120 in accordance with a representative embodiment. The electrical filter 120 comprises series BAW resonators 121 and shunt BAW resonators 122. By way of illustration, the series BAW resonators 121 and shunt BAW resonators 122 may comprise the acoustic resonators described in connection with the representative embodiments of FIG. 1A. The electrical filter 120 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 120 is merely illustrative and other topologies are contemplated. Moreover, the acoustic resonators of the representative embodiments are contemplated in a variety of applications besides duplexers. By way of illustration, the series BAW resonators 121 and shunt BAW resonators 122 may comprise the BAW resonators described in connection with the representative embodiments of FIGS. 2A-3, which may include BAW resonators described above in connection with the representative embodiments of FIGS. 1A-1B.

The electrical filter 120 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 120 is merely illustrative and other topologies are contemplated. Moreover, the BAW resonators of the representative embodiments are contemplated in a variety of applications besides duplexers.

Figure 2A:
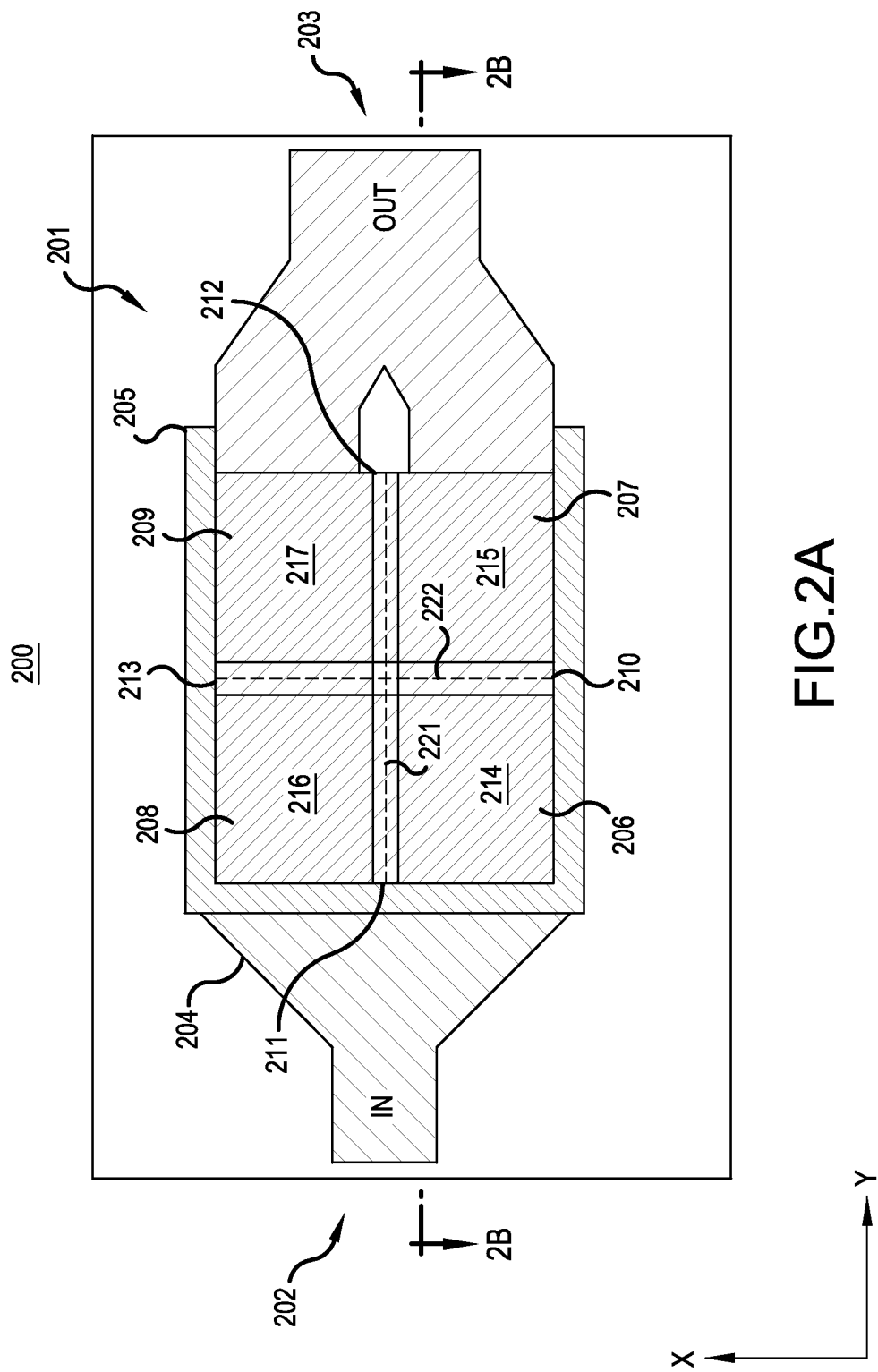
FIG. 2A is a top view of a BAW resonator in accordance with a representative embodiment.

Referring to FIG. 2A, a top view of a BAW resonator 200 is depicted. Many aspects of the BAW resonators 100, 100' and terminology used in their descriptions are common to the BAW resonator 200, and are often not repeated to avoid obscuring the presently described representative embodiments.

The BAW resonator 200 comprises a substrate 201, an input 202 and an output 203. As noted above, the substrate 201 comprises a material that provides a comparatively good thermal conductivity, which as described more fully below, fosters heat dissipation in the BAW resonator 200.

The BAW resonator 200 comprises a lower electrode 204 disposed over acoustic reflectors (not shown in FIG. 2A) disposed in the substrate 201. A piezoelectric layer 205 is disposed over the lower electrode 204. A first upper electrode 206, a second upper electrode 207, a third upper electrode 208 and a fourth upper electrode 209 are disposed over the piezoelectric layer 205. The first upper electrode 206 is electrically connected to the first upper electrode 207 by a first bridge 210; and to the third upper electrode 208 by a second bridge 211. The second upper electrode 207 is electrically connected to the fourth upper electrode 209 by a third bridge 212; and the fourth upper electrode 209 is electrically connected to the third upper electrode 208 by a fourth bridge 213.

As will become clearer as the present description continues, each of the first~fourth upper electrodes 206~209 are disposed over respective acoustic reflectors (again, not shown in FIG. 2A). As such, each of the first~fourth upper electrodes 206~209 are components of four acoustic stacks each comprising one of the first~fourth upper electrodes 206~209, the piezoelectric layer 205 and the lower electrode 204. Each of these acoustic stacks is disposed over a respective acoustic reflector, and thereby form, respectively, a first active area 214, a second active area 215, a third active area 216 and a fourth active area 217. As noted above, in embodiments where the acoustic reflectors are cavities, first~fourth active areas 214~217 are often referred to as membranes. Although individual active areas, the first~fourth active areas 214~217 are electrically connected through the first~fourth bridges 210~213. As such, the BAW resonator 200 comprises a plurality of individual active areas (e.g., membranes) in the same BAW resonator. In the representative embodiment, there are four active areas. Generally, in order to provide a substantially symmetric thermal distribution in BAW resonator 200, it is beneficial to avoid disposing first~fourth active areas 214~217 of BAW resonator 200 asymmetrically, or providing first~fourth active areas 214~217 having unequal areal dimensions. Rather, in order to provide a substantially symmetric thermal distribution in BAW resonator 200, the first~fourth active areas 214~217 have substantially identical areal dimensions, and are substantially symmetric relative to each other. To this end, the first~fourth active areas 214~217 are substantially symmetric about lines 221 and 222 (i.e., symmetric about an origin at the intersection of lines 221 and 222). It is noted, however that this symmetry is amenable to variance. Notably, the shape of the first~fourth active areas 214~217 is considered substantially symmetric even though certain structures, such as cantilevered portions or frame elements, could alter the shapes one or more of the first-~fourth active areas 214~217. Finally, while not as beneficial from the perspective of thermal distribution, asymmetric active areas, or active areas with unequal areal dimensions, or both, are contemplated by the present teachings.

Although the first~fourth active areas 214~217 are substantially square in shape, it is noted that this is merely illustrative. In fact, the first~fourth upper electrodes 206~209 are apodized and may comprise more or fewer than four (4) sides. Some representative shapes are described in the patents, patent application publications, and patent applications incorporated above.

The use of four active areas is also merely illustrative; and more or fewer may be implemented in realizing the BAW resonator 200. Of course, at least two active areas (e.g., as described in connection with FIG. 3 below) must be used. Furthermore, and as will become clearer as the present description continues, the first~fourth active areas 214~217 are electrically connected in parallel. This is also merely illustrative. For example, rather than being disposed in two rows, the first~fourth active areas 214~217 could be arranged in a single row (e.g., linearly) and could be electrically connected in series, or in parallel.

Notably, the areal dimensions of the active areas (e.g., first~fourth active areas 214~217) are selected to provide improved thermal properties, as described presently and below. Generally, the number of active areas selected to make up BAW resonator 200 is selected to provide a desired combined areal dimension for a particular power requirement. Beneficially, the formation of a BAW resonator 200 comprising a plurality of comparatively smaller active areas provides improved thermal properties compared to a single BAW resonator having a single active area (i.e., single membrane having an acoustic stack disposed over a single cavity) having the same areal size as the combined areal dimensions of the plurality of smaller active areas. By way of example, compared to a single resonator having the same size active area as the combined area of the first~fourth active areas 214~217, the thermal properties and performance of the BAW resonator 200 are improved at the same energy density. Some improvements in the thermal properties are directly attributable to the comparatively small size of the active areas, whereas some improvements in the thermal properties are a result of the structure of the BAW resonator 200. The latter are described more fully below. As to the former, generally, the thermal profiles of BAW resonators having a comparatively smaller active areas are more uniform than comparatively large active areas, with "hot spots" that are symmetric compared to those of comparatively large active area BAW resonators, and low temperatures compared to comparatively large active area BAW resonators. Moreover, compared to a single BAW resonator disposed over a single acoustic reflector and having an area substantially equal to the sum of the areas of the first~fourth active areas 214~217, the BAW resonators of the present teachings when used in filters used in comparatively high power handling applications, because of the comparatively small areal dimensions of the first~fourth active areas 214~217, generally run "cooler" and heat more uniformly than comparatively large known BAW resonators and for the same power density. Stated somewhat differently, comparatively smaller active area BAW resonators have a comparatively more uniform stress profile, which ultimately results in better power handling compared to comparatively large active area BAW resonators having the same energy density. By providing BAW resonators of the present teachings with a plurality of active areas, better thermal and electrical performance is realized compared to a BAW resonator with a single active area for the same operating power.

Figure 2B:
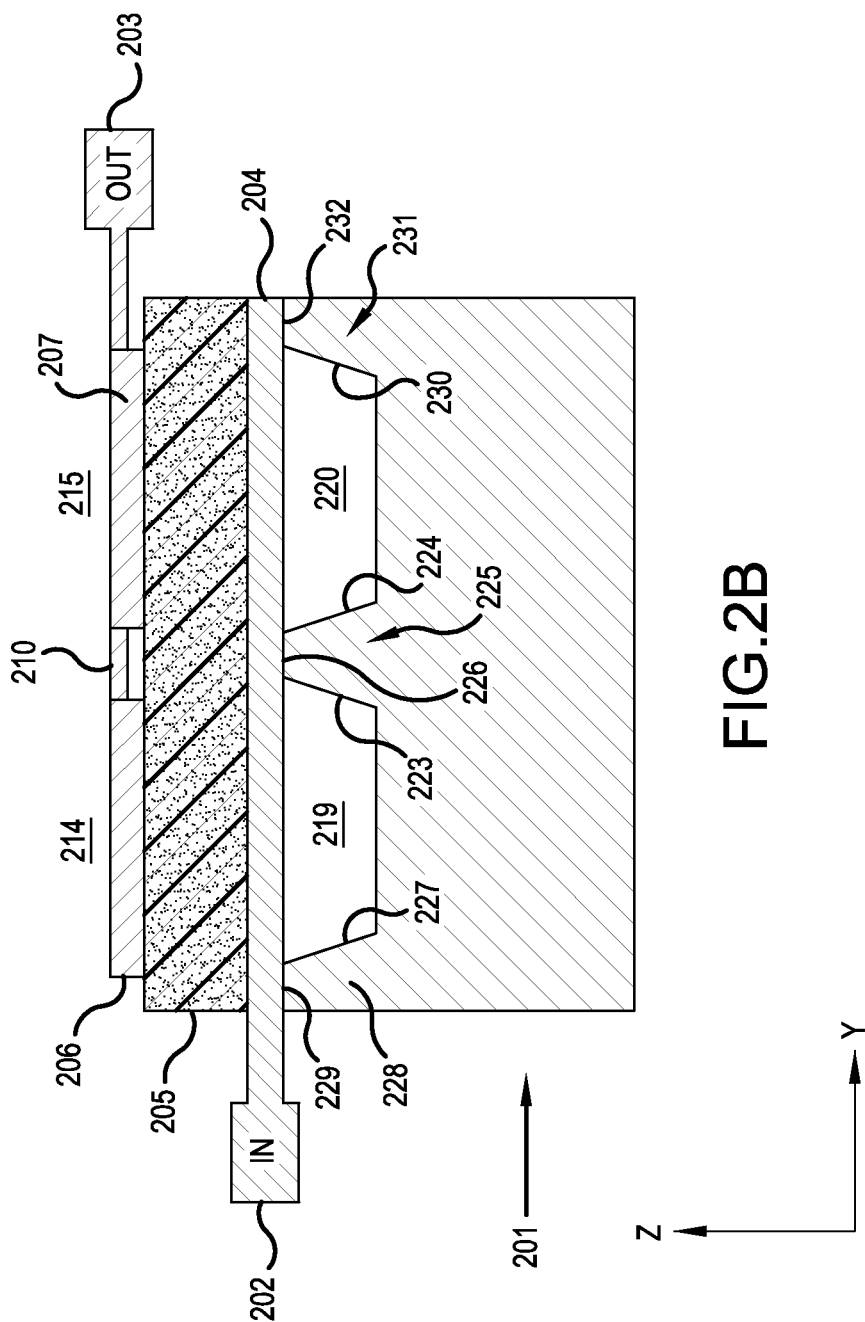
FIG. 2B is a cross-sectional view of the BAW resonator of FIG. 2A taken along line 2B-2B.

FIG. 2B is a cross-sectional view of the BAW resonator 200 of FIG. 2A taken along line 2B-2B. Many aspects of the BAW resonator 200 described above are not repeated to avoid obscuring the presently described representative embodiments.

The BAW resonator 200 comprises a first acoustic reflector 219 and a second acoustic reflector 220 disposed in the substrate 201. As noted above in connection with the representative embodiments of FIGS. 1A, 1B, the first and second acoustic reflectors 219, 220 may be either cavities (e.g., cavity 107) or acoustic Bragg reflectors (e.g., acoustic Bragg reflector 107'). Notably, the substrate 101 is etched and either a sacrificial material is disposed in the opening formed and released by known methods (e.g., through one or more release openings) after forming the acoustic stack of BAW resonator 200; or alternating layers of comparatively low acoustic impedance and comparatively high acoustic impedance (e.g., that form acoustic Bragg reflector 107') are provided therein prior to forming the acoustic stack of BAW resonator 200.

Regardless of whether the first and second acoustic reflectors 219, 220 (or a third acoustic reflector 222 and a fourth acoustic reflector 223, described below in connection with FIG. 2C) are cavities or acoustic Bragg reflectors, each acoustic reflector comprises walls that in turn are walls of pillars. As can be appreciated, adjacent to each of the first~fourth active areas 214~217 is a respective inactive area, such as discussed above, for example in connection with FIG. 1A. Each of the inactive areas terminate on one or more of the pillars, which beneficially serve as anchor points of BAW resonator 200.

By way of example, as depicted in FIG. 2B, a first wall 224 of first acoustic reflector 219 and a first wall 224 of the second acoustic reflector 220 form walls of a first pillar 225 that extends between the first and second acoustic isolators 219, 220. The first pillar 225 comprises a first surface 226 over which the lower electrode 204 is disposed. Similarly, a second wall 227 of the first acoustic reflector 219 forms a wall of a second pillar 228 comprising a second surface 229 over which the lower electrode 204 is disposed. Furthermore, a second wall 230 of the second acoustic reflector 220 forms a wall of a third pillar 231 comprising a third surface 232 over which the lower electrode 204 is disposed. Each inactive area adjacent to the first~fourth active areas 214~217 terminates on one or more of the first~third pillars 225, 228, 231 (and other pillars described below), which serve as anchor points.

The first~third pillars 225, 228, 231 (and other pillars described below) of the BAW resonator 200 are located in comparatively close proximity to one or more of the first~fourth active areas 214~217 and thus anchor points are provided close to each of the first~fourth active areas 214~217 compared, for example, to a single BAW resonator disposed over a single acoustic reflector and having an area substantially equal to the sum of the areas of the first~fourth active areas 214~217. As such, dissipation of heat generated at the first~fourth active areas 214~217 of BAW resonator 200 is efficient compared to the noted single BAW resonator. This heat dissipation, sometimes referred to as thermal grounding, is beneficially improved in BAW resonators of the present teachings, at least in part, by providing a plurality of active areas in close proximity to anchor points compared to a single BAW resonator having an active area with an areal dimension substantially the same as the sum of the areal dimensions of the plurality of active areas that comprise the BAW resonators of the present teachings. As such, and quite beneficially, the BAW resonators of the present teachings (e.g., BAW resonator 200) operate at reduced temperatures compared to a single BAW resonator having an active area with an areal dimension substantially the same as the sum of the areal dimensions of the plurality of active areas that comprise the BAW resonators of the present teachings.

Furthermore, because of the heat dissipation offered by the plurality of anchor points in comparatively close proximity to the plurality of active areas that comprise the BAW resonators of the present teachings, at a comparatively same level of energy density (energy divided by the active area or volume) as a single BAW resonator having an active area with an areal dimension substantially the same as the sum of the areal dimensions of the plurality of active areas that comprise the BAW resonators of the present teachings, the comparatively small active areas of BAW resonators of the representative embodiments operate at lower temperatures. This results in improved power handling and acceptable electrical performances in the BAW resonators of the present teachings. These improvements in power handling in BAW resonators of the present teachings, which are contemplated for use in a ladder filter such as electrical filter 120, or in a lattice filter, foster improved power handling in such filters.

Figure 2C:
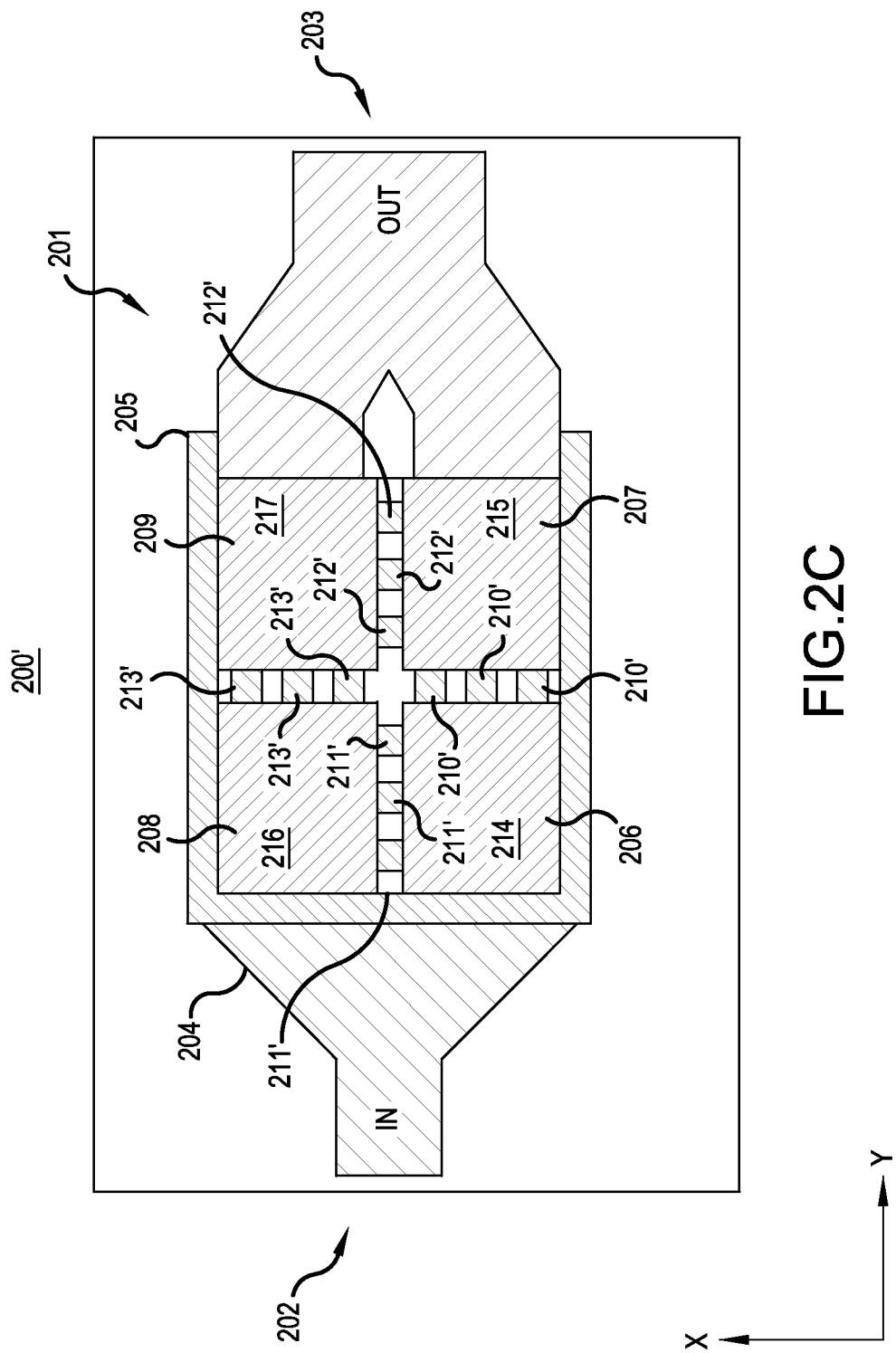
FIG. 2C is a top view a BAW resonator in accordance with a representative embodiment.

Referring to FIG. 2C, a top view of a BAW resonator 200' according to another representative embodiment is depicted. Many aspects of the BAW resonators 100, 100', 200 described above and terminology used in their descriptions are common to the BAW resonator 200', and are often not repeated to avoid obscuring the presently described representative embodiments.

The BAW resonator 200' comprises substrate 201, input 202 and output 203. As noted above, the substrate 201 comprises a material that provides a comparatively good thermal conductivity, which as described more fully below, fosters heat dissipation in the BAW resonator 200'.

The BAW resonator 200' comprises lower electrode 204 disposed over acoustic reflectors (not shown in FIG. 2C) disposed in the substrate 201. Piezoelectric layer 205 is disposed over the lower electrode 204. First upper electrode 206, second upper electrode 207, third upper electrode 208 and fourth upper electrode 209 are disposed over the piezoelectric layer 205. The first upper electrode 206 is electrically connected to the first upper electrode 207 by a plurality of first bridges 210'; and to the third upper electrode 208 by a plurality of second bridges 211'. The second upper electrode 207 is electrically connected to the fourth upper electrode 209 by plurality of third bridges 212'; and the fourth upper electrode 209 is electrically connected to the third upper electrode 208 by a plurality of fourth bridges 213'.

The first~fourth plurality of bridges 210'18 213' are generally disposed selectively along the length of the respective connection sides of the first~fourth active areas 214~217. Each of the respective first~fourth plurality of bridges 210'~213' has a width, and each of the respective first~fourth plurality of bridges 210'~213' are spaced from one another by a spacing. Notably, the widths may be the same in magnitude or may be different; and the spacings may be the same magnitude or may be different. Moreover, the widths and the spacings may be the same or may be different. Using a plurality of bridges on a connection side of an active area beneficially improves acoustic performance as described in concurrently filed, and commonly owned U.S. patent application Ser. No. 14/725,176, now U.S. Pat. No. 10,084,425, entitled "Acoustic Resonator Structure Having a Plurality of Connection-Side Contacts" naming Paul A. Bradley, et al. as inventors. The entire disclosure of U.S. patent application Ser. No. 14/725,176 is specifically incorporated herein by reference.

As depicted in FIGS. 1A-2B, the lower electrodes 102, 204 of the representative embodiments are substantially flat and substantially uniform in thickness across their area. Moreover, and as depicted in FIG. 2E, the lower electrodes 102, 204 of the representative embodiments are a single layer, which extends over all of the first and second acoustic reflectors 219, 220 (and the third and fourth acoustic reflectors 222, 223 described below in connection with FIG. 2C) and at least partially over the substrate 201. Because the lower electrodes 102, 204 of the representative embodiments are substantially flat and uniform in thickness, dissipation of heat generated in each of the first~fourth active areas 214~217 is substantially uniform. Stated somewhat differently, rather than having individual lower electrodes that extend slightly beyond the edges of each of the acoustic reflectors, or one or more lower electrodes that are not substantially flat, there is no disruption in the thermal sink the lower electrodes 102, 204 provide. This aspect of the present teachings further contributes to efficient and uniform heat dissipation from the first~fourth active areas 214~217, which, as noted above, fosters cooler operating temperatures of the BAW resonator 200 and improved power handling compared to a single BAW resonator having a single active area (i.e., single membrane having an acoustic stack disposed over a single cavity) having the same areal size as the combined areal dimensions of the first~fourth active areas 214~217.

Referring to FIGS. 2D-2G, various components of BAW resonator 200 are depicted in a pseudo-exploded view.

Figure 2D:
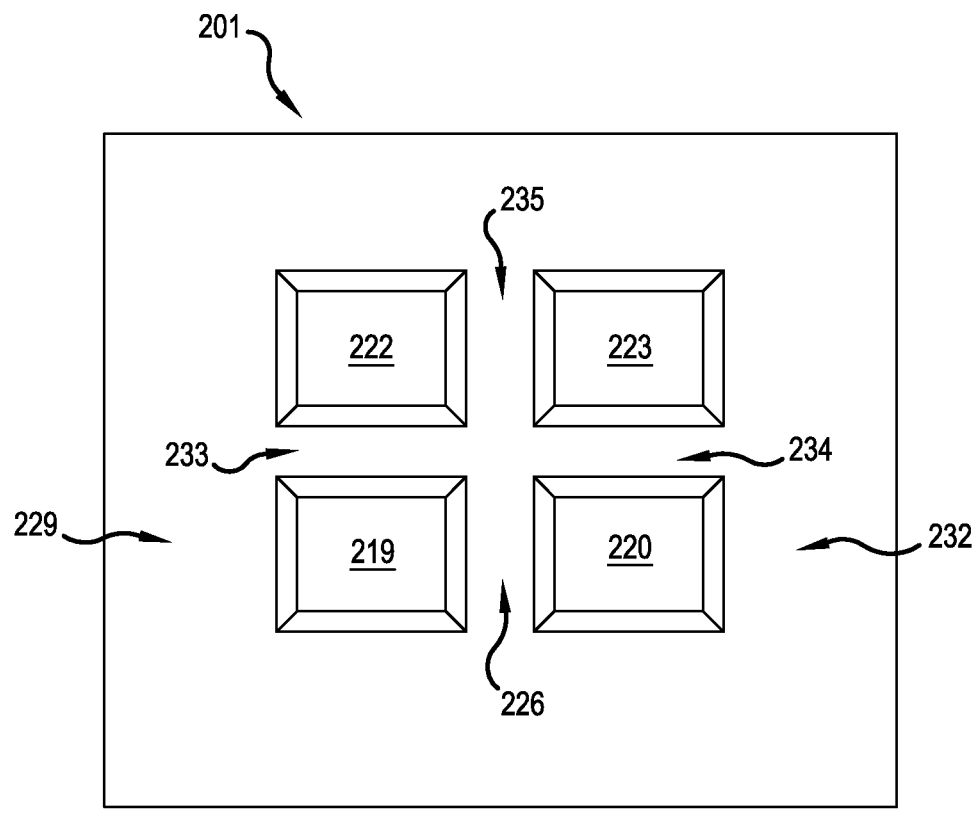
FIG. 2D is a top view of a substrate comprising a plurality of acoustic reflectors in accordance with a representative embodiment.

Referring first to FIG. 2D, the substrate 201 comprising first~fourth acoustic reflectors 219, 220, 222 and 223 disposed therein is depicted without subsequent layers disposed thereover. As can be appreciated, between and adjacent to each of the first~fourth acoustic reflectors 219, 220, 222 and 223, are first surface 226 of first pillar 225, second surface 229 of second pillar 228, and third surface 232 of third pillar 231. Moreover, a fourth surface 233 of a fourth pillar (not shown) extends between the first and third acoustic reflectors 219, 222; a fifth surface 234 of a fifth pillar (not shown) extends between the second and fourth acoustic reflectors 220, 223; a sixth surface 235 of a sixth pillar (not shown) extends between the third and fourth acoustic reflectors 222, 223.

Like first and second active areas 214, 215, third and fourth active areas 216, 217 are disposed in close proximity to the first~sixth surfaces 226, 229, 232, 233, 234, 235 and their respective pillars. As such, like inactive areas adjacent to the first and second active areas 214, 215, inactive areas adjacent to third and fourth active areas 216, 217 terminate on one or more of the pillars, which beneficially serve as anchor points of BAW resonator 200. In this manner, efficient and uniform dissipation of heat from the third and fourth active areas 216, 217 occurs, beneficially resulting in cooler operating temperatures and improved power handling, as discussed above.

Figure 2E:
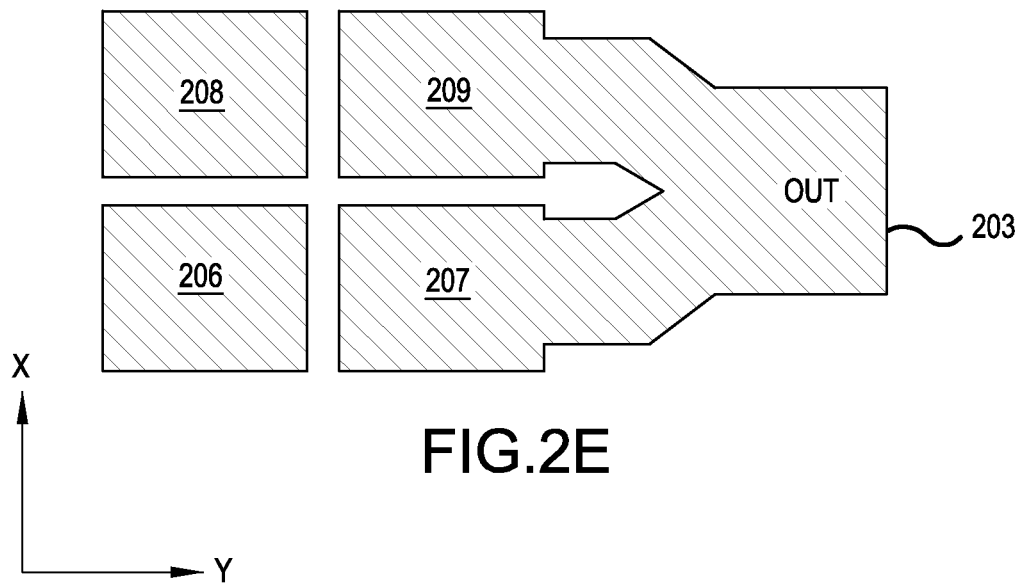
FIG. 2E is a top view of a plurality of upper electrodes and an output contact in accordance with a representative embodiment.
Figure 2F:
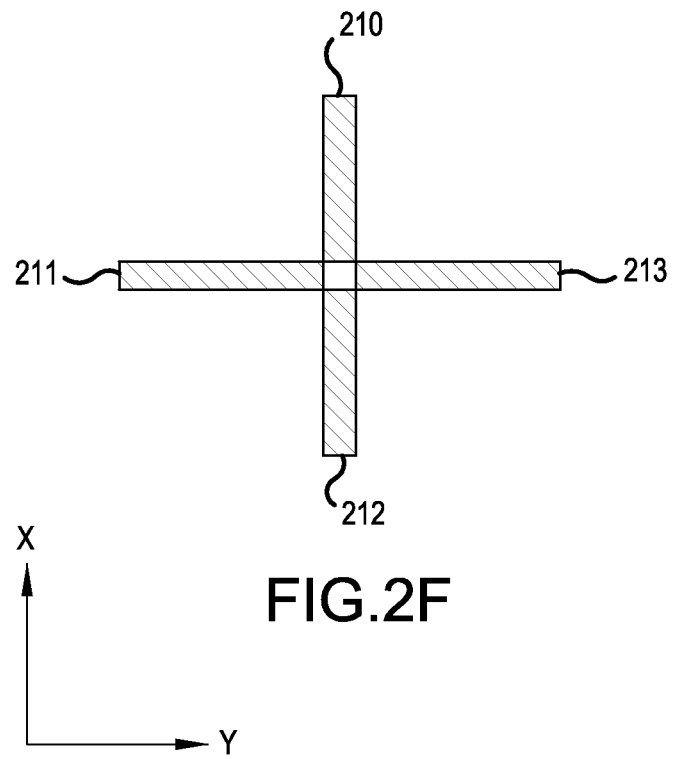
FIG. 2F is a top view of a plurality of bridge connections for connecting the plurality of upper electrodes of the representative embodiment of FIG. 2E.

Referring to FIG. 2E, the first~fourth upper electrodes 206~209 are depicted, with the second and fourth upper electrodes 207, 209 electrically connected to the input. As can be seen, the first~fourth upper electrodes 206~209 are individual electrodes. By providing individual electrodes separated by gaps, the areal dimensions inactive areas adjacent to the first~fourth active areas 214~217 are reduced since the area of overlap of the lower electrode 204, the piezoelectric layer 205 and the first~fourth upper electrodes 206~209 is reduced compared to a single upper electrode. As such, the parasitic capacitance of the BAW resonator 200 is beneficially reduced. As described, for example, in above-referenced U.S. Pat. No. 8,248,185 and in connection with FIGS. 1A-1B, the first~fourth bridges 210~213, which are depicted in FIG. 2F, enable the electrical connection of the first~fourth upper electrodes 206~209 without contributing to the magnitude of the inactive area, and thus foster improved electrical performance of the BAW resonator 200 through reduction in the parasitic capacitance attendant to the inactive areas.

Figure 2G:
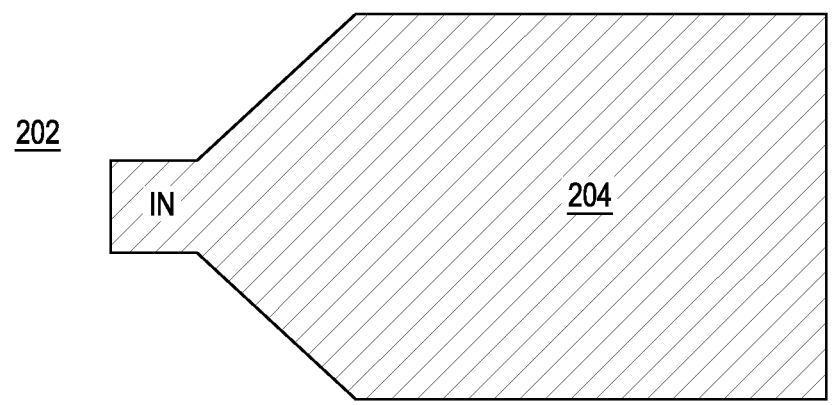
FIG. 2G is a top view of a bottom electrode and an input contact in accordance with a representative embodiment.
Figure 2G:
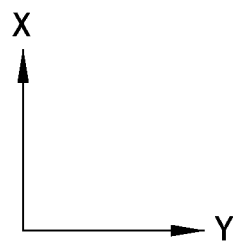

Referring to FIG. 2G, lower electrode 204 of the representative embodiments is a single layer. As noted above, the lower electrode 204 extends over all of the first~fourth reflectors 219~223, and at least partially over the substrate 201. Because the lower electrode 204 is substantially flat and uniform in thickness, dissipation of heat generated in each of the first~fourth active areas 214~217 is substantially uniform.

Referring to FIG. 3, a top view of a BAW resonator 300 is depicted. Many aspects of the BAW resonators 100, 100' and 200 and terminology used in their descriptions are common to the BAW resonator 300, and are often not repeated to avoid obscuring the presently described representative embodiments. Generally, BAW resonator 300 is substantively the same as BAW resonator 200, except the individual active areas are more rectangular in shape, with only two active areas comprising the BAW resonator 300.

The BAW resonator 300 comprises a substrate 301, an input 302 and an output 303. As noted above, the substrate 201 comprises a material that provides a comparatively good thermal conductivity, which as described more fully below, fosters heat dissipation in the BAW resonator 300.

The BAW resonator 300 comprises a lower electrode 304 disposed over acoustic reflectors (not shown) disposed in the substrate 301. A piezoelectric layer 305 is disposed over the lower electrode 304. A first upper electrode 306 and a second upper electrode 307 are disposed over the piezoelectric layer 305. The first upper electrode 306 is electrically connected to the second upper electrode 307 by bridge 308. Notably, rather than a single bridge (i.e., bridge 308), a plurality of bridges (e.g., second bridges 211') could be used to electrically connect the first upper electrode 306 to the second upper electrode 307.

As such, each of the first and second upper electrodes 306, 307 are components of two acoustic stacks each comprising one of the first and second upper electrodes 306, 307, the piezoelectric layer 305 and the lower electrode 304. Each of these acoustic stacks is disposed over a respective acoustic reflector, and thereby form, respectively, a first active area 309, and a second active area 310. As noted above, in embodiments where the acoustic reflectors are cavities, the active areas are often referred to as membranes.

Although individual active areas, the first and second upper electrodes 306, 307 are electrically connected through bridge 308. As such, the BAW resonator 300 comprises a plurality of individual active areas (e.g., membranes) in the same BAW resonator. In the representative embodiment, there are two active areas. Generally, and as described above in connection with the representative embodiments of BAW resonators 200, 200' in FIGS. 2A and 2B, in order to provide a substantially symmetric thermal distribution in BAW resonator 300, the first and second active areas 309, 310 are substantially symmetric about the x or y axis of the coordinate system depicted, and have substantially identical areal dimensions. Although the first and second active areas 309, 310 are substantially rectangular in shape, it is noted that this is merely illustrative. In fact, the first and second upper electrodes 306, 307 are generally apodized and may comprise more than four (2) sides. Some representative shapes are described in the patents, patent application publications, and patent applications incorporated above. Like the shape of the first~fourth active areas 214~217, the shape of the first and second active areas 309, 310 is considered substantially symmetric even though certain structures, such as cantilevered portions or frame elements, could alter the shape one or both of the first and second active areas 309, 310. Finally, while not as beneficial from the perspective of thermal distribution, asymmetric active areas, or active areas with unequal areal dimensions, or both, are contemplated by the present teachings.

Like the first~fourth active areas 214~217, the areal dimensions of the first and second active areas 309, 310 are selected to provide improved thermal properties, as described above in connection with BAW resonator 200. Generally, the number of active areas selected to make up BAW resonator 300 is selected to provide a desired combined areal dimension for a particular power requirement. Beneficially, the formation of a BAW resonator 300 comprising a plurality of comparatively smaller active areas provides improved thermal properties compared to a single BAW resonator having a single active area (i.e., single membrane having an acoustic stack disposed over a single cavity) having the same areal size as the combined areal dimensions of the plurality of smaller active areas. By way of example, compared to a single resonator having the same size active area as the combined area of the first and second active areas 309, 310, the thermal properties and performance of the BAW resonator 300 is improved at the same energy density. Again, and as described more fully in connection with representative embodiments above, some improvements in the thermal properties are directly attributable to the comparatively small size of the active areas.

Other improvements in the thermal properties are a result of the structure of the BAW resonator 300. Notably, like BAW resonator 200, BAW resonator 300 comprises pillars (not shown in FIG. 3) disposed between and adjacent to the acoustic reflectors (not shown in FIG. 3). Each of the inactive areas terminate on one or more of the pillars, which beneficially serve as anchor points of BAW resonator 300. As described in more detail above, heat dissipation through the anchor points, sometimes referred to as thermal grounding, is beneficially improved in BAW resonators of the present teachings, at least in part, by providing a plurality of active areas in close proximity to anchor points compared to a single BAW resonator having an active area with an areal dimension substantially the same as the sum of the areal dimensions of the plurality of active areas that comprise the BAW resonators of the present teachings. As such, and quite beneficially, the BAW resonators of the present teachings (e.g., BAW resonator 300) operate at reduced temperatures compared to a single BAW resonator having an active area with an areal dimension substantially the same as the sum of the areal dimensions of the plurality of active areas that comprise the BAW resonators of the present teachings.

Furthermore, like lower electrode 204, lower electrode 304 is substantially flat and substantially uniform in thickness across its area. Moreover, the lower electrode 304 of the representative embodiments is a single layer, which extends over all of the acoustic reflectors and at least partially over the substrate 201. Because the lower electrode 304 of the representative embodiments is substantially flat and uniform in thickness, dissipation of heat generated in each of the first and second active areas 309, 310 is substantially uniform. Stated somewhat differently, rather than having individual lower electrodes that extend slightly beyond the edges of each of the acoustic reflectors, or one or more lower electrodes that are not substantially flat, there is no disruption in the thermal sink the lower electrode 304 provides. This aspect of the present teachings further contributes to efficient and uniform heat dissipation from the first and second active areas 309, 310, which, as noted above, fosters cooler operating temperatures of the BAW resonator 300 and improved power handling compared to a single BAW resonator having a single active area (i.e., single membrane having an acoustic stack disposed over a single cavity) having the same areal size as the combined areal dimensions of the first and second active areas 309, 310.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

We claim:

1. A bulk acoustic wave (BAW) resonator, comprising: a plurality of separate acoustic reflectors disposed in a substrate; a single lower electrode disposed over the plurality of separate acoustic reflectors; a piezoelectric layer disposed over the lower electrode and a plurality of upper electrodes being provided over a respective one of the plurality of separate acoustic reflectors.

2. A BAW resonator as claimed in claim 1, wherein the plurality of upper electrodes is connected to one another.

3. A BAW resonator as claimed in claim 1, wherein each of the plurality of separate acoustic reflectors comprises a cavity.

4. A BAW resonator as claimed in claim 1, wherein each of the plurality of separate acoustic reflectors comprises alternating layers of comparatively high acoustic impedance material, and comparatively low acoustic impedance material.

5. A BAW resonator as claimed in claim 2, wherein an electrical connection between each of the upper electrodes comprises a respective bridge.

6. A BAW resonator as claimed in claim 5, wherein one of the respective bridges is disposed between each adjacent upper electrode.

7. A BAW resonator as claimed in claim 2, wherein an electrical connection between each of the upper electrodes comprises a plurality of bridges.

8. A BAW resonator as claimed in claim 5, wherein each of the respective bridges is filled with a dielectric material.

9. A BAW resonator as claimed in claim 8, wherein the dielectric material comprises one of non-etchable borosilicate glass (NEBSG), carbon doped silicon dioxide (CDO), or silicon carbide (SiC).

10. A BAW resonator as claimed in claim 3, a contacting overlap of each of the plurality of upper electrodes, the piezoelectric layer, the lower electrode, and each of the separate acoustic reflectors constituting an individual active area, wherein each of the individual active areas are respective membranes, and each of the respective membranes is substantially a same shape.

11. A BAW resonator as claimed in claim 1, wherein the piezoelectric layer comprises aluminum nitride (AlN) comprising scandium (Sc).

12. A bulk acoustic wave (BAW) resonator, comprising: a plurality of separate acoustic reflectors disposed in a substrate, the substrate comprising a plurality of pillars; a single lower electrode disposed over the plurality of separate acoustic reflectors; a piezoelectric layer disposed over the lower electrode and a plurality of upper electrodes, disposed over the piezoelectric layer, one of the plurality of upper electrodes being disposed over a respective one of the plurality of separate acoustic reflectors.

13. A BAW resonator as claimed in claim 12, wherein each of the pillars provides a thermal anchor for dissipation of heat.

14. A BAW resonator as claimed in claim 12, wherein the plurality of upper electrodes are electrically connected to one another.

15. A BAW resonator as claimed in claim 12, wherein each of the plurality of separate acoustic reflectors comprises a cavity, and each cavity terminates at respective pillars.

16. A BAW resonator as claimed in claim 12, wherein each of the plurality of separate acoustic reflectors comprises alternating layers of comparatively high acoustic impedance material and comparatively low acoustic impedance material, and each of the alternating layers of comparatively high acoustic impedance material and comparatively low acoustic impedance material terminates at respective pillars.

17. A BAW resonator as claimed in claim 14, wherein the electrical connection between each of the upper electrodes comprises a plurality of bridges.

18. A BAW resonator as claimed in claim 17, wherein one of the plurality of bridges is disposed between each adjacent upper electrode.

19. A BAW resonator as claimed in claim 17, wherein the electrical connection between each of the upper electrodes comprises a plurality of bridges.

20. A BAW resonator as claimed in claim 17, wherein each of the plurality of bridges comprises an electrically conductive material, and each of the plurality of bridges is filled with a dielectric material.

21. A BAW resonator as claimed in claim 20, wherein the dielectric material comprises one of non-etchable borosilicate glass (NEBSG), carbon doped silicon dioxide (CDO), or silicon carbide (SiC).

22. A BAW resonator as claimed in claim 12, a contacting overlap of each of the plurality of upper electrodes, the piezoelectric layer, the lower electrode, and each of the separate acoustic reflectors constituting an individual active area, wherein each of the respective individual active areas are substantially a same shape.

23. A BAW resonator as claimed in claim 12, wherein the piezoelectric layer comprises aluminum nitride (AlN) comprising scandium (Sc).

* * * * *